United States Patent
Liu et al.

(10) Patent No.: US 6,175,496 B1
(45) Date of Patent: Jan. 16, 2001

(54) HEAT-DISSIPATING DEVICE

(75) Inventors: Jen-Hao Liu; Hsiang Chang; Hsiang-Wei Chen; Shih-Wei Lin, all of Taipei (TW)

(73) Assignee: Compal Electronics, Inc., Taipei (*) Notice: Under 35 U.S.C. 154(b), the term of this patent shall be extended for 0 days.

(21) Appl. No.: 09/455,505

(22) Filed: Dec. 6, 1999

(51) Int. Cl.⁷ .................................................. H05H 7/20
(52) U.S. Cl. ............................................ 361/695; 361/700
(58) Field of Search ........................... 174/15.2; 361/687, 361/700, 696, 695, 825, 829, 831; 62/259.2; 454/184, 353

(56) References Cited

U.S. PATENT DOCUMENTS

| | | | |
|---|---|---|---|
| 5,448,495 | * | 9/1995 | Liu .......................................... 361/695 |
| 5,986,883 | * | 11/1999 | Johnson et al. ....................... 361/695 |
| 6,002,586 | * | 12/1999 | Chen et al. ............................ 361/695 |
| 6,072,696 | * | 6/2000 | Horii ..................................... 361/695 |
| 6,086,476 | * | 7/2000 | Paquin et al. ......................... 454/184 |

* cited by examiner

Primary Examiner—Gregory Thompson
(74) Attorney, Agent, or Firm—Pillsbury Madison & Sutro LLP

(57) ABSTRACT

A heat-dissipating device is adapted for dissipating heat inside an equipment housing which includes a housing part having upright first and second side walls and a bottom wall. The first and second side walls extend transverse to each other such that the first and second side walls and the bottom wall cooperate to form a corner portion of the housing part. The heat-dissipating device includes a remote heat-dissipating unit adapted to be disposed in the equipment housing and having a heat transfer plate, a heat exchanger pipe connected to the heat transfer plate, and a heat sink coupled to the heat exchanger pipe, and a fan unit adapted to be disposed in the corner portion. The fan unit includes a fan housing having a fan disposed therein, a fastening seat member adapted to be fastened removably on the first side wall and the bottom wall and retaining the fan housing in the housing part, and a supporting member having an anchoring frame part connected to the fan housing, a reinforcing frame part extending from the anchoring frame part, and a fastening frame part extending transversely from the reinforcing frame part and spaced apart from the fan housing to form a sink mounting space therebetween. The heat sink is disposed in the sink mounting space and is fastened removably to the fastening frame part.

8 Claims, 6 Drawing Sheets

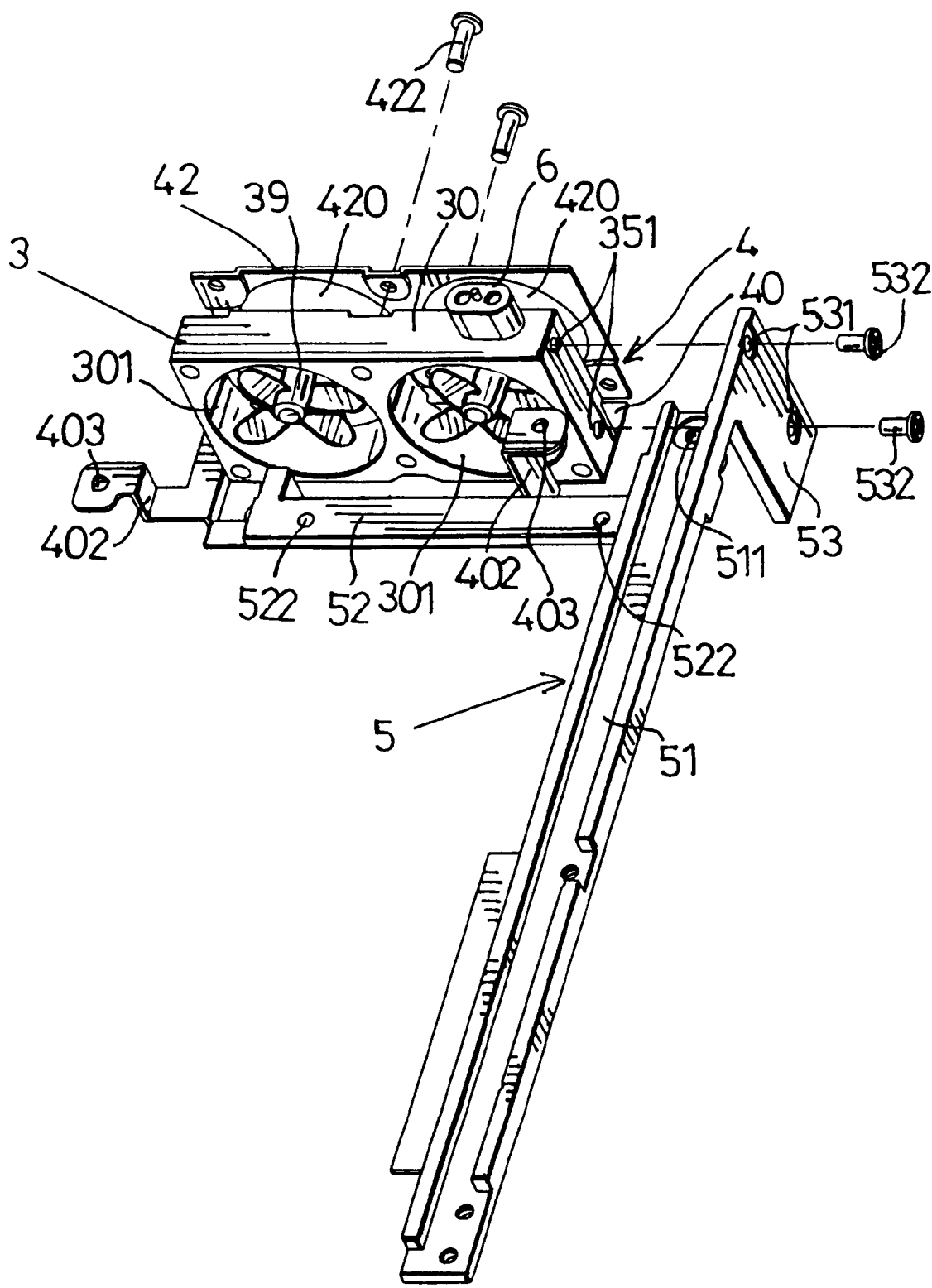
F I G. 3

HEAT-DISSIPATING DEVICE

BACKGROUND OF THE INVENTION

1. Field of the Invention

The invention relates to a heat-dissipating device, more particularly to a heat-dissipating device that further serves to reinforce an equipment housing.

2. Description of the Related Art

FIG. 1 illustrates a conventional heat-dissipating device for dissipating heat generated by a CPU 14 disposed on a main board 15 inside a computer housing (not shown). The conventional heat-dissipating device includes a heat transfer plate 10, a heat exchanger pipe 11 connected to the heat transfer plate 10, a heat sink 12 coupled to the heat exchanger pipe 11, and a fan 13 connected to the heat sink 12. The fan 13 is generally mounted on the computer housing 12 (not shown).

As shown in FIG. 2, when the CPU 14 and electronic components underlying the heat exchanger pipe 11 have to be replaced or repaired, the fan 13 is detached from the housing, and the heat transfer plate 10 is detached from the CPU 14, thereby leading to inconvenience during replacing and repairing.

SUMMARY OF THE INVENTION

Therefore, the object of the present invention is to provide a heat-dissipating device that can be easily assembled and that further serves to reinforce an equipment housing.

According to the present invention, a heat-dissipating device is adapted for dissipating heat inside an equipment housing. The equipment housing includes a housing part having upright first and second side walls and a bottom wall interconnecting bottom edges of the first and second side walls. The first and second side walls extend transverse to each other such that the first and second side walls and the bottom wall cooperate to form a corner portion of the housing part. The first side wall is formed with a vent hole adjacent to the second sidewall. The heat-dissipating device includes a remote heat-dissipating unit and a fan unit.

The remote heat-dissipating unit is adapted to be disposed in the equipment housing, and has a heat transfer plate, a heat exchanger pipe connected to the heat transfer plate, and a heat sink coupled to the heat exchanger pipe.

The fan unit is adapted to be disposed in the corner portion of the housing part. The fan unit includes a fan housing, a fastening seat member and a supporting member. The fan housing has a fan disposed therein. The fastening seat member is adapted to be fastened removably on the first side wall and the bottom wall of the housing part, and retains the fan housing in the housing part adjacent to the vent hole in the first side wall. The supporting member has an anchoring frame part connected to the fan housing, a reinforcing frame part extending from the anchoring frame part and adapted to be disposed adjacent to the second side wall, and a fastening frame part extending transversely from the reinforcing frame part and spaced apart from the fan housing to form a sink mounting space therebetween. The heat sink is disposed in the sink mounting space, and is fastened removably to the fastening frame part.

In view of its novel arrangement, the fan unit further serves to reinforce the corner portion of the housing part of the equipment housing.

BRIEF DESCRIPTION OF THE DRAWINGS

Other features and advantages of the present invention will become apparent in the following detailed description of the preferred embodiment with reference to the accompanying drawings, of which:

FIG. 3 is an exploded perspective view showing a fan unit of the preferred embodiment of a heat-dissipating device according to the present invention;

DETAILED DESCRIPTION OF THE PREFERRED EMBODIMENT

Figure 5:
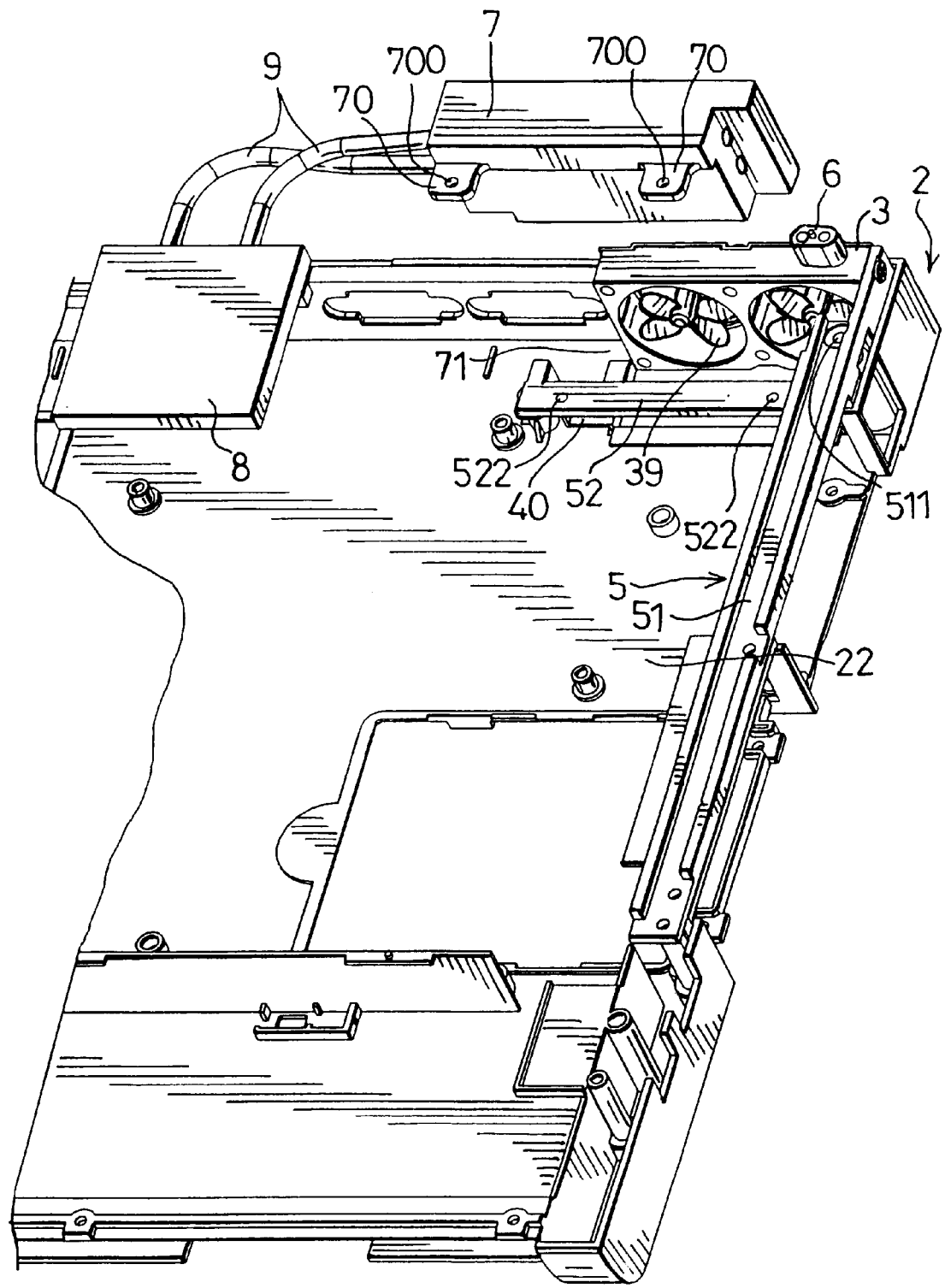
FIG. 5 is a fragmentary perspective view showing the preferred embodiment and a detachable remote heat-dissipating unit thereof.
Figure 6:
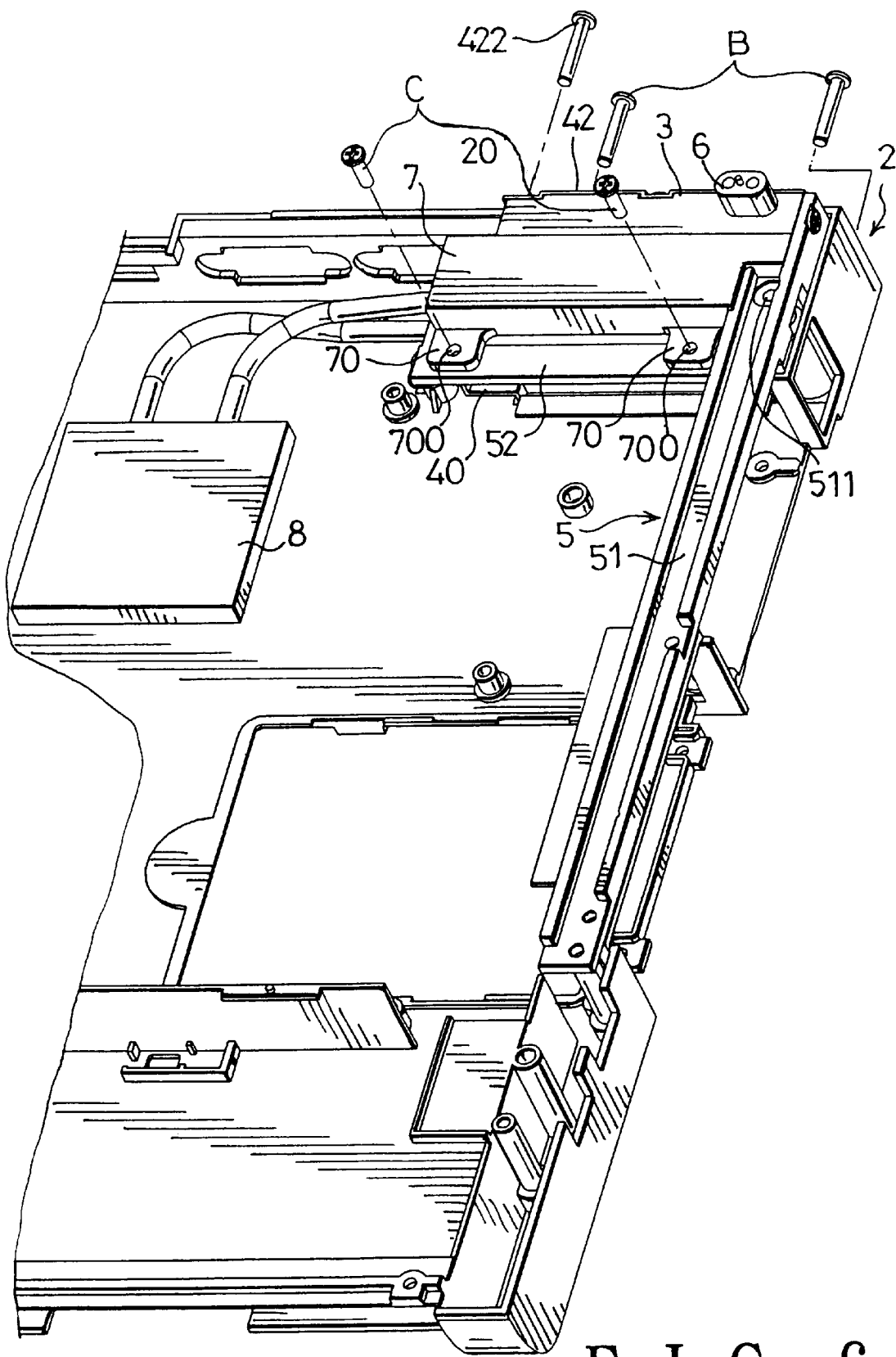
FIG. 6 is an assembled fragmentary perspective view of the preferred embodiment.
Figure 7:
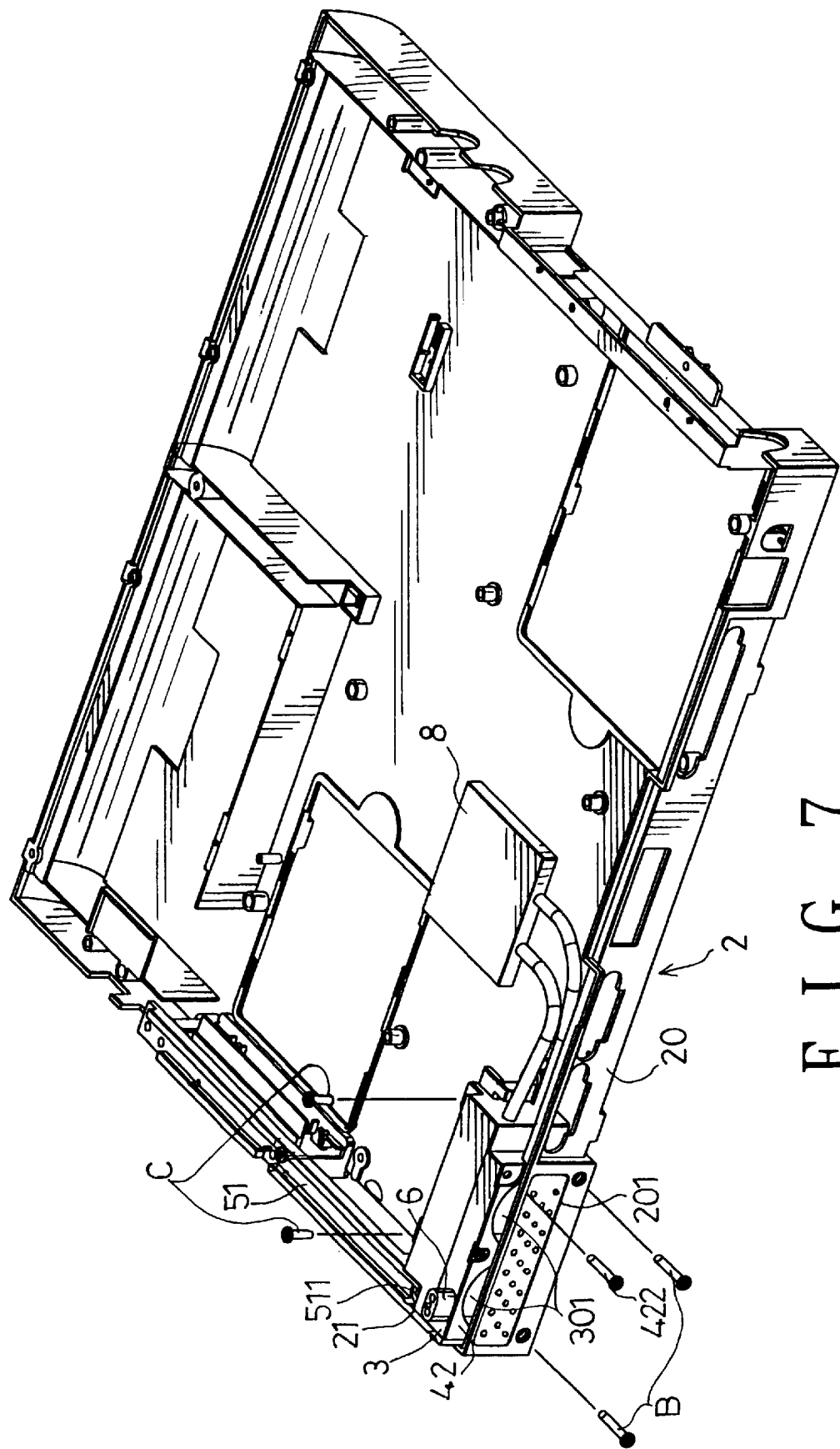
FIG. 7 is another perspective view showing the preferred embodiment when assembled on the computer housing.

Referring to FIGS. 5 to 7, the preferred embodiment of a heat-dissipating device according to the present invention is shown to be adapted for dissipating heat inside a computer housing. The computer housing includes a housing part 2 having upright first and second side walls 20, 21, and a bottom wall 22 interconnecting bottom edges of the first and second side walls 20, 21. The first and second side walls 20, 21 extend transverse to each other such that the first and second side walls 20, 21 and the bottom wall 22 cooperate to form a corner portion 23 of the housing part 2. The first side wall 20 is formed with a vent plate 201 adjacent to the second side wall 21. The heat-dissipating device includes a remote heat-dissipating unit and a fan unit.

The heat-dissipating unit is adapted to be disposed in the computer housing, and has a heat transfer plate 8, two heat exchanger pipes 9 connected to the heat transfer plate 8, and a heat sink 7 coupled to the heat exchanger pipes 9.

Figure 1:
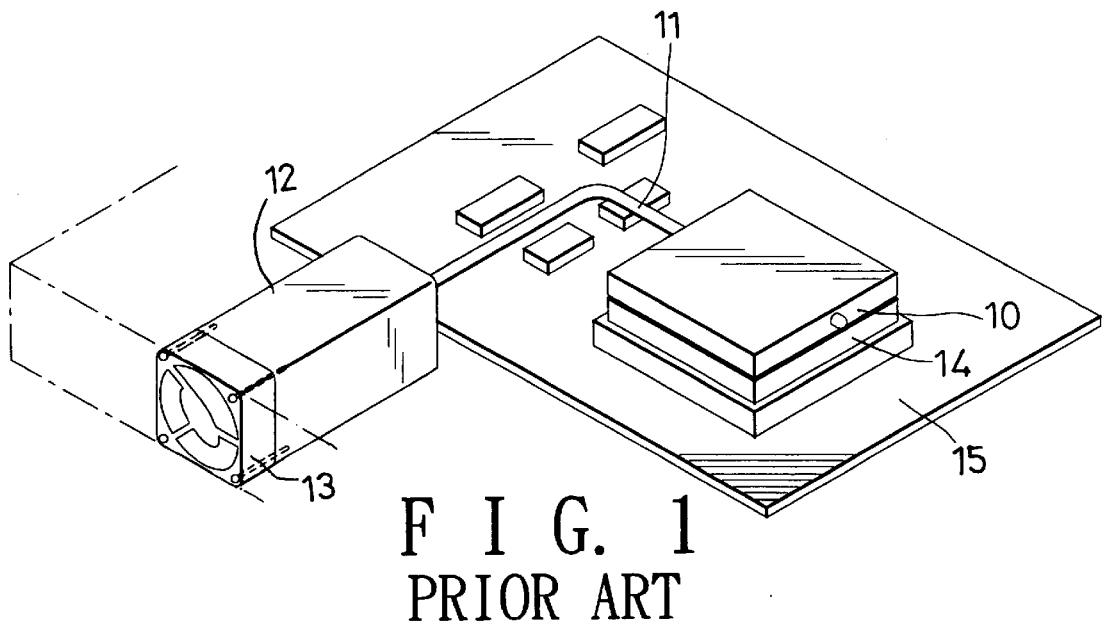
FIG. 1 is a perspective view of a conventional heat-dissipating device disposed on a CPU.
Figure 2:
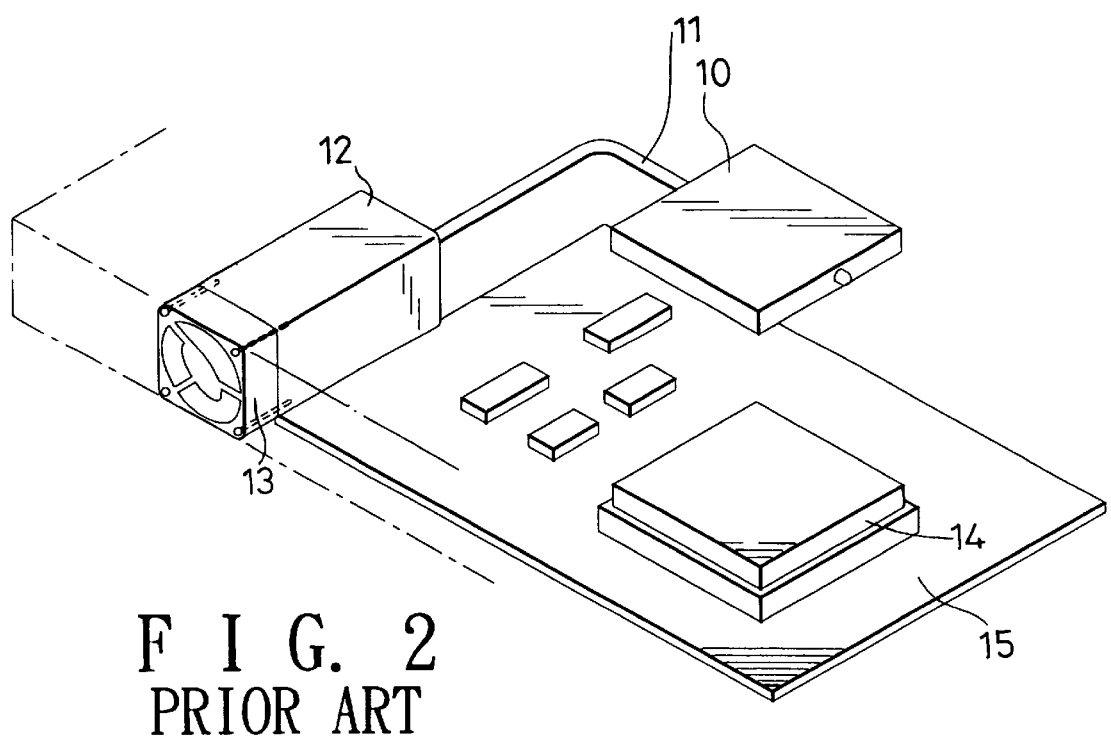
FIG. 2 is a perspective view showing the conventional heat-dissipating device when removed from the CPU of FIG. 1.
Figure 4:
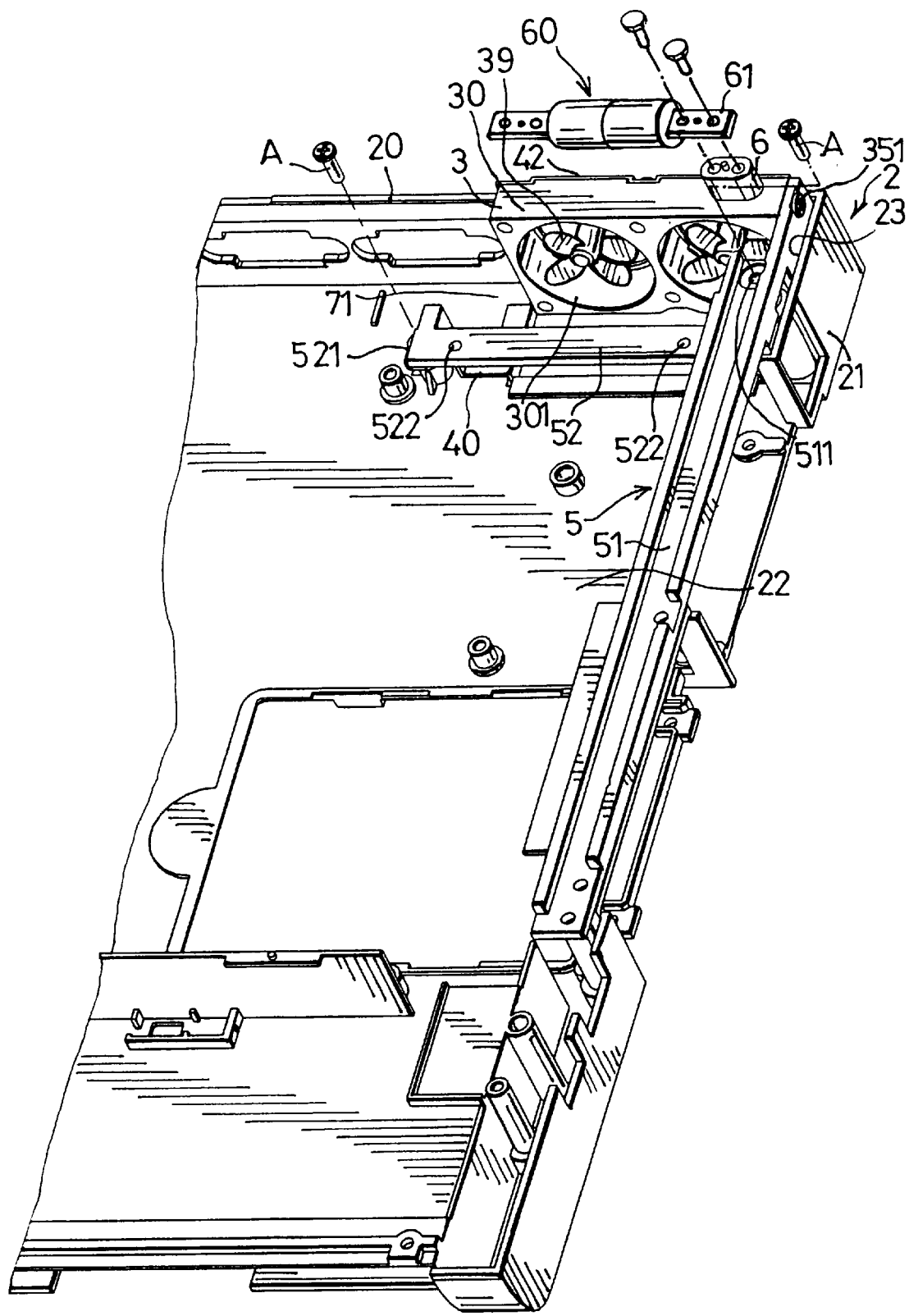
FIG. 4 is a fragmentary perspective view showing the fan unit of FIG. 3 when assembled on a computer housing.

Referring to FIGS. 3 and 4, the fan unit is adapted to be disposed in the corner portion 23 of the housing part 2. The fan unit includes a fan housing 3, a fastening seat member 4 and a supporting member 5.

The fan housing 3 has two fans 39 disposed in two chambers 301, which are to be registered with the vent plate 201 in the housing part 2.

The fastening seat member 4 is adapted to be fastened removably on the first side wall 20 and the bottom wall 22 of the housing part 2, and retains the fan housing 3 in the housing part 2 adjacent to the vent plate 201 in the first side wall 20. The fastening seat member 4 is generally L-shaped, and has a bottom plate portion 40 adapted to be disposed between the fan housing 3 and the bottom wall 22 of the housing part 4, and an upright plate portion 42 that extends upwardly from the bottom plate portion 40 and that is adapted to be disposed between the fan housing 3 and the first side wall 20. A plurality of screw fasteners 422 extend through a plurality of through holes formed in the upright plate portion 42 and the fan housing 3, respectively, for fastening the fan housing 3 on the fastening seat member 4. The upright plate portion 42 is formed vent openings 420 that are adapted to permit air flow through the vent plate 201. The bottom plate portion 40 is formed with two upward arm extensions 402.

The supporting member 5 has an anchoring frame part 53, a reinforcing frame part 51, and a fastening frame part 52.

The anchoring frame part 53 is formed as an upright plate fastened to the fan housing 3 by means of a pair of screw fasteners 532 that extend threadedly through two through holes 531 formed therein and two threaded holes 351 formed in the fan housing 3. The anchoring frame part 53 is adapted to be disposed between the fan housing 3 and the second side wall 21. The reinforcing frame part 51 extends from the anchoring frame part 53, and is formed as an elongated frame part that is adapted to be disposed adjacent to and extend along the second side wall 21. The fastening frame part 52 extends transversely from the reinforcing frame part 51, and is spaced apart from the fan housing 3 to form a sink mounting space 71 therebetween. The heat sink 7 is disposed in the sink mounting space 71 and is fastened removably to the fastening frame part 52.

One of a pair of first screw fasteners (A) extends through a through hole 511 formed in the reinforcing frame part 51 and a through hole 403 formed in one arm extension 402 adjacent to the second side wall 21, and is adapted for fastening the arm extension 402 and the reinforcing frame part 51 on the bottom wall 22. The other one of the first screw fasteners (A) extends through a lug portion 521 formed on the fastening frame part 52 and a through hole 403 formed in the other arm extension 402, and is adapted for fastening the other arm extension 402 and the fastening frame part 52 on the bottom wall 22. A pair of second screw fasteners (B), as shown in FIGS. 6 and 7, extend through the first side wall 20 and the fan housing 3, and is adapted for fastening the upright plate portion 42 of the fastening seat member 4 and the fan housing 3 on the first side wall 20. A pair of third screw fasteners (C) extend through two through holes 700 formed in two lug portions 70 that extend from the heat sink 7 and two through holes 522 formed in the fastening frame part 52, respectively, for fastening the heat sink 7 to the fastening frame part 52.

A pivot seat 6 is mounted on a top side 30 of the fan housing 3 and is adapted for mounting one end 61 of a hinge 60 thereon. The other end of the hinge 60 is adapted to be connected to a computer display (not shown) in a known manner.

The remote heat-dissipating unit can be easily detached from the computer housing when electronic components underlying the heat transfer 8 and the heat exchanger pipe 9 have to be repaired or replaced. The fan unit further serves to reinforce the corner portion 23 of the housing part 2 of the computer housing. The object of the invention is thus met.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A heat-dissipating device adapted for dissipating heat inside an equipment housing, the equipment housing including a housing part having upright first and second side walls and a bottom wall interconnecting bottom edges of the first and second side walls, the first and second side walls extending transverse to each other such that the first and second side walls and the bottom wall cooperate to form a corner portion of the housing part, the first side wall being formed with a vent hole adjacent to the second side wall, said heat-dissipating device comprising:

a remote heat-dissipating unit adapted to be disposed in the equipment housing and having a heat transfer plate, a heat exchanger pipe connected to said heat transfer plate, and a heat sink coupled to said heat exchanger pipe; and a fan unit adapted to be disposed in the corner portion of the housing part, said fan unit including
    a fan housing having a fan disposed therein,
    a fastening seat member adapted to be fastened removably on the first side wall and the bottom wall of the housing part and retaining said fan housing in the housing part adjacent to the vent hole in the first side wall, and
    a supporting member having an anchoring frame part connected to said fan housing, a reinforcing frame part extending from said anchoring frame part and adapted to be disposed adjacent to the second side wall, and a fastening frame part extending transversely from said reinforcing frame part and spaced apart from said fan housing to form a sink mounting space therebetween, said heat sink being disposed in said sink mounting space and being fastened removably to said fastening frame part;

whereby, said fan unit further serves to reinforce the corner portion of the housing part of the equipment housing.

2. The heat-dissipating device as claimed in claim 1, wherein said fastening seat member is generally L-shaped and has a bottom plate portion adapted to be disposed between said fan housing and the bottom wall, and an upright plate portion that extends upwardly from said bottom plate portion and that is adapted to be disposed between said fan housing and the first side wall, said upright plate portion being formed with a vent opening that is adapted to permit air to flow through the vent hole, said heat-dissipating device further comprising a first screw fastener adapted for fastening said bottom plate portion on the bottom wall, and a second screw fastener adapted for fastening said upright plate portion and said fan housing on the first side wall.

3. The heat-dissipating device as claimed in claim 2, wherein said bottom plate portion is formed with at least one arm extension, said first screw fastener being adapted to fasten said arm extension on the bottom wall.

4. The heat-dissipating device as claimed in claim 3, wherein said anchoring frame part is formed as an upright plate fastened to said fan housing and adapted to be disposed between said fan housing and the second side wall, said reinforcing frame part being formed as an elongated frame part that is adapted to be disposed adjacent to and extend along the second side wall.

5. The heat-dissipating device as claimed in claim 4, wherein said first screw fastener is further adapted to fasten said reinforcing frame part on the bottom wall.

6. The heat-dissipating device as claimed in claim 5, further comprising a third screw fastener for fastening said heat sink to said fastening frame part.

7. The heat-dissipating device as claimed in claim 1, wherein said anchoring frame part is formed as an upright plate fastened to said fan housing and adapted to be disposed between said fan housing and the second side wall, said reinforcing frame part being formed as an elongated frame part that is adapted to be disposed adjacent to and extend along the second side wall.

8. The heat-dissipating device as claimed in claim 1, further comprising a pivot seat mounted on a top side of said fan housing and adapted for mounting one end of a hinge thereon.

* * * * *